United States Patent

Killy

[15] 3,650,761

[45] Mar. 21, 1972

[54] PHOTOSENSITIVE RESIST

[72] Inventor: Rosemonde W. Killy, Seattle, Wash.

[73] Assignee: Powers Chemco, Inc., Glen Cove, N.Y.

[22] Filed: Dec. 15, 1969

[21] Appl. No.: 885,374

[52] U.S. Cl. ..................................96/115 R, 96/35.1, 96/88

[51] Int. Cl. ........................................G03c 1/68, G03c 5/00

[58] Field of Search ....................................96/115, 88, 35.1

[56] References Cited

UNITED STATES PATENTS 3,453,110 7/1969 Delzenne et al. ........................96/115

FOREIGN PATENTS OR APPLICATIONS 695,197 8/1953 Great Britain ...........................96/115

64,412 9/1965 Japan ......................................96/115

*Primary Examiner*—Norman G. Torchin

*Assistant Examiner*—Richard E. Fichter

*Attorney*—Morgan, Finnegan, Durham and Pine

[57] ABSTRACT

A new photosensitive resist for the production of photoengravings, photolithographic plates and printed circuits, having excellent photographic speed and acid resistance comprises a solution in a volatile organic solvent of an ester of a polyvinyl alcohol and a furoic acid, said polyvinyl alcohol having a molecular weight of about 86,000 and having at least 70% of the -OH groups possible in the molecule esterified, preferably almost 100%. The furoic ester may be sensitized by a cyclic compound containing one or more keto groups.

8 Claims, No Drawings

PHOTOSENSITIVE RESIST

DESCRIPTION OF THE INVENTION

The present invention provides a photosensitive resist formed from an ester of polyvinyl alcohol and a furoic acid, such as 2-furoic acid, furanacrylic acid, 5-bromo-2-furoate, 2-α-methyl-2-furanacrylic acid, or 2-coumarillic acid.

The polyvinyl alcohol used has from 70 to 100% of the possible -OH groups esterified, and from 90 to 100% is preferred; and a molecular weight of from 14,000 to 115,000, preferably about 86,000.

Such a photosensitive resist solution may be coated on a plate to become a printing member or other etched or plated surface, and after drying and exposure to actinic light, it may be developed to remove the unexposed portions of the polymer by immersion in a suitable organic solvent. Thereafter the plate may be etched or plated in a conventional manner.

Among the useful volatile organic solvents are: 1,4-dioxane, methyl cellusolve acetate, nitromethane, ethylene dichloride, butyrolactone, methyl carbitol, chloroform, methyl ethylketone and many other organic, non-reactive solvents; and these same solvents may be used as a developer.

In general, the polymeric ester is used in a 2 to 10% solution in the organic solvent, usually about 6% by weight solution, and after drying and exposure may be developed to remove the unexposed ester by immersion in the same or another organic solvent.

The sensitizer comprises a cyclic compound containing one or more carbonyl groups. Among the suitable sensitizers are:

4 methyl benzophenone
4-4', - Bis dimethylamino benzophenone
4-4', - Bis diethylamino benzophenone
Bis -p- methylstyryl ketone
4-methylumbelliferone
2-methyl-1,4-naphthoquinone
N-methyl 2-quinolone
2-nitrofluorene
3-(2-furyl) acrylophenone
2-furaldioxime
Cholesteryl crotonate
1,2-napthoquinone
5-phenyl-2,4-pentadienophenone
Benzathracene -7-12 dione
Benzathracene -7-one Such sensitizers are used in a quantity of 2.5 to 10% by weight based on the weight of the photosensitive polymer.

In the following examples, unless otherwise stated, the polyvinyl alcohol had from 90 to 100% of the possible -OH groups esterified and an average molecular weight of from 14,000 to 115,000, preferably about 86,000.

To control the degree of crosslinking, or stability of the polyvinylfuran over a certain period of time, the following inhibitors may be used:

hydroquinone
m -methoxyphenol
p -methoxyphenol
guaicol
chloranil
4- Ter -butylcathechol According to the reducing potential of the inhibitors, the percentage needed varies from 0.10 to 2%, 0.5% based on the weight of the polymer. The addition of a very small quantity of furoic or picric acids to a solution of polyvinyl furan ester containing a sensitizer and inhibitor increases the stability of the said solution.

Suitable dyes of the exposed and developed film resist are:

Crystal Violet No. 3 (C.I. Basic No. 3)
Hectolene Dyes (C.I. Hectolene Basic Dyes)

As used below sensitivity is measured by exposing a layer of the photosensitive resin through a photographic step wedge having density increments of 0.15. After development and dyeing the percentage of transmittance of light through the last visual step of the control is measured and divided by the percent of transmittance of light through the last visual step of the sample.

EXAMPLE 1

44 g. (1.0 M) of polyvinyl alcohol were heated overnight at 85°–90 C. with 400 cc. of dry pyridine. The suspension was cooled to 25°–30° C. and 400 cc. of dry pyridine were poured into the flask. 130.53 g. (1.0 M) of 2- furoyl chloride were added in 15 minutes. A purple coloration and a slight exothermic reaction occur. After heating for 2 hours at 85° C., with occasional stirring, the dark brown liquid phase was diluted with 800 cc. acetone and cooled to room temperature. Filtration followed by precipitation onto ice water gave a fibrous polymer (polyvinyl-2-furoate) which was washed until chlorine free and air dry over night in a dark room.

The solution for formation of the photosensitive resist on a printing plate or other member to be etched comprises a 2 to 8%, preferably 2% by weight solution of polyvinyl-2-furoate made from a polyvinyl alcohol having an average molecular weight of from 14,000 to 115,000 and preferably about 86,000. In the polyvinyl alcohol from 90 to 100% of all of the -OH groups possible are esterified. This polymer is dissolved in a volatile organic solvent such as methyl ethyl ketone, preferably ethylene dichloride or 1,4-dioxane.

EXAMPLE 1 A

The plate to be etched or electroplated is coated with a 4% solution of polyvinyl-2-furoate in 1,4-dioxane, the excess is drained off and the coating is allowed to dry, after which the resist is exposed to a high-intensity light source, such as a mercury arc using a halftone or line negative of the subject to be reproduced. The sensitivity of the polyvinyl-2-furoate layer is defined as 1.0, for purposes of this patent.

After exposure, the resist layer is developed by immersion in a volatile organic solvent, such as methylethyl ketone, methyl cellosolve acetate or preferably ethylene dichloride or 1,4-dioxane, and after development, the resist coated plate may be rinsed in water, and etched or electroplated in the conventional manner.

EXAMPLE 2

The steps of Example 1 were repeated using the same solution of polyvinyl-2-furoate in 1,4-dioxane but with the addition of from 0.05 to 0.3%, preferably 0.1%, by weight of a sensitizer, such as benzoyl peroxide or 2 to 10% of benzanthracene 7,12-dione based on the weight of the polymer. With benzoyl peroxide, the sensitivity was increased, while with benzanthracene-7, 12-dione it was 7.25, compared with the unsensitized polymer counted as 1.0.

EXAMPLE 3

25 g. of 2-furanacrylic acid and 100 ml. of thionyl chloride were heated and refluxed under anhydrous conditions for 10 minutes. Excess thionyl chloride was then drawn off under vacuum, and the 2-furanacrylic acid chloride was distilled, then recrystallized from cyclohexane, and dried in a dark room in a dessicator under vacuum.

4.4 g. polyvinyl alcohol (partially or preferably completely hydrolyzed) were heated for several hours on a steam bath with 20 ml. dry pyridine. The suspension was cooled, 20 ml. of dry pyridine were added, followed by the slow addition of 17.22 g. of the 2-furanacrylic acid chloride. An exothermic reaction yielded a yellow precipitate, and the mixture was heated for 4 hours at 75° C. This mixture was then diluted with acetone up to 200 ml., filtered and poured into ice water with vigorous stirring to give a light beige, fibrous, resinous precipitate.

The precipitate was separated by filtration, washed with water until chlorine free and was then air dried in a dark room.

10 g. of the 2-furanacryclic acid ester of polyvinyl alcohol were then dissolved in 500 g. of a volatile organic solvent, preferably 1,4-dioxane and used in the procedure as specified in Example 1 A.

Polyvinyl-2-furanacrylate was found to have a sensitivity of 7.0 compared with 1.0 for polyvinyl-2-furoate. Its sensitivity was greatly enhanced by the use of about 2 to 10%, preferably 5%, by weight of the polymer of a sensitizer such as benzathracene-7,12-dione.

EXAMPLE 4

A photosensitive resist comprising polyvinyl-2,4,5-trimethyl-3-furoate was prepared from the acid chloride and polyvinyl alcohol. When used in a 2% by weight solution in 1,4-dioxane, as in Example 1, it has a sensitivity of 0.07 which was greatly enhanced by the use of a sensitizer, such as 5% of benzanthracene-7,12-dione based on the weight of the polymer.

EXAMPLE 5

A photosensitive resist comprising polyvinyl-2-coumarilate was prepared by heating 8.1 g. of recrystallized coumarilic acid with an excess of thionyl chloride and heated on a steam bath for 2 hours under anhydrous conditions. The excess thionyl chloride was then distilled off and the residue was recrystallized in hexane to give colorless crystals (m. p. 51° C.). Then, 1.24 g. of polyvinyl alcohol were heated overnight at 85° C. with 10 cc. of dry pyridine. After cooling, 10 cc. of dry pyridine were added with 5 g. of coumarilic acid chloride. This mixture was then heated for 4 hours at 75° C., and after cooling the brown mass was diluted with acetone and precipitated in cold water. The fibrous polymer was filtered off, washed several times and air dried in the dark.

It was then dissolved, coated, dried, exposed and developed as in Example 1 A.

The resin had a sensitivity of 0.1 which could be greatly enhanced by the use of sensitizers such as a small quantity of benzanthracene-7,12-dione.

EXAMPLE 6

A photosensitive resist comprising polyvinyl-5-bromo-2-furoate was prepared by heating 19.1 g. of 5-bromo-2-furoic acid with an excess of thionyl chloride for 30 minutes under anhydrous conditions, after which the excess of thionyl chloride was drawn off by vacuum and the acid chloride was distilled (b. p. 147° C., at 67 mm. Hg.; m. p. 52° C.).

2.2 g. of polyvinyl alcohol were heated on a steam bath for several hours with 20 ml. of dry pyridine. After cooling, 20 ml. of dry pyridine were added, then slowly was added 11.52 g. of 5-bromo-2-furoyl chloride. After heating 4 hours at 50°–60° C., 20 cc. of pyridine were added and the viscous mass was filtered and precipitated onto methyl alcohol. The precipitated polymer was washed with ethyl alcohol and air dried, yielding 1 g. of polyvinyl-5-bromo-2-furoate.

This compound dissolved in 1,4-dioxane was coated, exposed, and developed as in Example 1 A and was then ready for etching or electroplating showing a relative sensitivity of 3.30.

EXAMPLE 7

10 g. of α-methyl-2-furanacrylic acid recrystallized from benzene were heated with an excess of thionyl chloride and 15 cc. of dry benzene on a steam bath for 3 hours. The excess of thionyl chloride and benzene were drawn off under vacuum, and the α-methyl-2-furanacrylic chloride had a b. p. 88°–90°/1 mm.

4.70 g. of α-methyl-2-furanacrylic acid chloride were added to a liquid comprising 1.1 g. polyvinyl alcohol which had been heated on a steam bath for several hours with 10 cc. of dry pyridine followed by cooling and the addition of 10 cc. of dry pyridine.

After heating for 4 hours at 50° to 70° C., the mass was diluted with 20 cc. pyridine and precipitated into cold water. The polymer was filtered off, rinsed and air dried.

On test, it had a sensitivity of 0.09 when used in accordance with the steps of Example 1 A. When sensitized with 5% of benzantracene-7,12-dione the sensitivity was greatly increased.

EXAMPLE 8

By a suitable selection of solvent for the development stage, the exposed resist on a plate can be developed as a positive rather than the usual negative. Thus, using a 2.5% solution of polyvinyl 2-furan acrylate sensitized with 5% (based on the weight of the resin) benzanthracene-7,12-dione to form the resist layer which is exposed in the normal manner to a negative image can be developed in monochlorobenzene, followed by dioxane to give a negative image on the plate. After this, the plate is rinsed in water and dried.

EXAMPLE 9

A photosensitive resist comprising a mixed ester of polyvinyl furoate and polyvinyl furanacrylate may be prepared by heating 4.4 g. of polyvinyl alcohol for several hours on a steam bath with 50 ml. of dry pyridine. After cooling, 50 ml. of dry pyridine were added followed by 12.40 g. of furoyl chloride and 0.782 g. of furanacrylic acid chloride. The mixture was heated for 4 hours at 75° C. and after dilution with acetone and filtration, the dark brown solution was precipitated in cold water; the fibrous precipitate was washed and air dried.

As the ratio of furanacrylic acid chloride to furoyl chloride increases, the solubility of the polyvinyl resin decreases. This mixed ester is photosensitive and may be used as in Example 1 A.

What is claimed is:

1. A photoresist-forming solution comprising a volatile organic solvent and an ester of polyvinyl alcohol and furoic acid of the structure

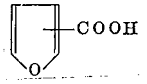

and derivatives thereof, said polyvinyl alcohol having an average molecular weight of from 14,000 to 115,000 and having at least 70% of the possible -OH groups esterified.

2. A solution according to claim 1 in which the ester is sensitized by a cyclic compound containing one or more carbonyl groups.

3. A solution according to claim 1 in which the ester is polyvinyl-2-furoate.

4. A solution according to claim 1 in which the ester is polyvinyl-5-bromo-2-furoate.

5. A solution according to claim 1 in which the ester is polyvinyl-2,4,5-trimethyl-3-furoate.

6. A solution according to claim 1 in which the ester is polyvinyl-2-coumarilate.

7. A photoresist-forming solution comprising a volatile organic solvent and the mixed polyvinyl ester derived from 2-furoic and 2-furan-acrylic acid chlorides, said furoate and furanacrylate moieties comprising about 90 and 10% by weight respectively of said ester.

8. A solution according to claim 7 in which the ester is the mixed polyvinyl ester derived from 2-furoic and chloride 2-furanacrylic acid chloride wherein the furanacrylate moiety is present in amounts to permit solubility of the resulting polyvinyl resin.

* * * * *